United States Patent [19]
Farquhar et al.

[11] Patent Number: 5,872,337
[45] Date of Patent: Feb. 16, 1999

[54] CHIP CARRIER AND CABLE ASSEMBLY REINFORCED AT EDGES

[75] Inventors: Donald Seton Farquhar; Stephen Joseph Fuerniss, both of Endicott, N.Y.; Charles Robert Davis, Jericho, Vt.; David Lee Questad, Vestal, N.Y.; Darbha Suryanarayana, Tempe, Ariz.; Jeffrey Alan Zimmerman, Endicott, N.Y.

[73] Assignee: International Business Machines Corporation, Armonk, N.Y.

[21] Appl. No.: 711,240

[22] Filed: Sep. 9, 1996

[51] Int. Cl.[6] .................................................. H05K 1/00
[52] U.S. Cl. ........................................ 174/254; 174/72 TR
[58] Field of Search .................................. 174/254–255, 174/256, 258, 259; 439/67, 77; 361/749, 750, 751, 792, 793, 794, 795; 74/71 R, 72 R, 72 TR; 428/901

[56] References Cited

U.S. PATENT DOCUMENTS

| | | | |
|---|---|---|---|
| 3,546,775 | 12/1970 | Lalmond et al. | 29/830 |
| 4,800,461 | 1/1989 | Dixon et al. | 361/751 |
| 5,103,293 | 4/1992 | Bonafino et al. | 257/702 |
| 5,121,297 | 6/1992 | Haas | 361/751 |
| 5,144,534 | 9/1992 | Kober | 361/751 |
| 5,206,463 | 4/1993 | DeMaso et al. | 174/254 |
| 5,212,279 | 5/1993 | Nomura et al. | 528/184 |
| 5,238,748 | 8/1993 | Effenberger et al. | 428/421 |
| 5,246,782 | 9/1993 | Kennedy et al. | 546/114 |
| 5,288,542 | 2/1994 | Cibulsky et al. | 428/209 |
| 5,363,275 | 11/1994 | Frankeny et al. | 361/749 |
| 5,379,193 | 1/1995 | Gall et al. | 361/784 |
| 5,468,159 | 11/1995 | Brodsky et al. | 439/501 |
| 5,499,444 | 3/1996 | Doane, Jr. et al. | 29/830 |
| 5,620,782 | 4/1997 | Davis et al. | 428/209 |

*Primary Examiner*—Bot L. Ledynh
*Assistant Examiner*—Kamand Cuneo
*Attorney, Agent, or Firm*—Schmeiser, Olsen & Watts; Lawrence R. Fraley

[57] ABSTRACT

Reinforcement members are disposed along only the transverse edge regions of selected flexible cables of an integral chip carrier and cable assembly, and along only the respectively aligned end areas of the chip carrier portion of the assembly. The reinforcement members may be disposed along all of the flexible cables and end areas of the assembly, or on only selected cable and end area portions of the assembly. The reinforcement members are formed of a tough tear resistant polymer material, such as a hot melt adhesive or polymer tape or film.

16 Claims, 3 Drawing Sheets

5,872,337

CHIP CARRIER AND CABLE ASSEMBLY REINFORCED AT EDGES

BACKGROUND OF THE INVENTION

1. Technical Field

This invention relates generally to an integral rigid chip carrier board and cable assembly and more particularly to such an assembly having selectively disposed tear-resistant reinforcement members.

2. Background Art

Multilayered rigid printed circuit boards having flexible printed circuit cables extending from the rigid board are particularly desirable in electronic components having high density circuit requirements. One example of such a circuit is disclosed in U.S. Pat. No. 4,800,461 issued Jan. 24, 1989 to Dixon, et al. The Dixon patent describes a multi layer rigid-flex printed circuit structure using insulator materials which, when subjected to elevated temperatures, do not expand sufficiently to cause damage to the structure.

More recently, a multilayer structure, identified as a high performance carrier, is formed of a plurality of decrete wiring cores that are selectively laminated to form an integral structure having a multilayer rigid-card region and flexible cables extending outwardly from the rigid-card region. The materials used to construct the individual core and cable subassemblies are silica ($SiO_2$) filled polytetrafluoroethylene (PTFE), normally having a thickness of about 50 $\mu$m thick when fully densified, a 25 $\mu$m thick layer of copper-invar-copper (CIC) and copper having a thickness of about 5–12 $\mu$m for the conductive layers. The overall final thickness of the individual core-cable subassembly ranges from about 250 $\mu$m to about 275 $\mu$m.

The materials selected for construction of the high performance carrier are selected to provide optimum electrical signal transmission and insulation properties. However, it has been found that the high performance carrier is prone to transverse tearing, particularly in the junction area between the rigid card section and the flexible cable section of the assembly. Once a tear has been initiated, and propagation started, only a very small force is necessary to extend the fracture across the structure. This characteristic of the structure reduces potential reliability and structural integrity. The addition of additional reinforcement layers throughout the structure, or the use of thicker dielectric materials, is undesirable because of the added thickness that would result in the structure, the added material costs that would be incurred, and the added manufacturing steps that would be required to form a fully reinforced structure.

The present invention is directed to overcoming the problems set forth above. It is desirable to have a multilayered structure, having a rigid chip carrier board and integrally formed flexible cables extending from the chip carrier board, that is resistant to transverse tearing. It is also desirable to have such a structure that is economical to produce and does not significantly add to the overall thickness of the structure.

SUMMARY OF THE INVENTION

In accordance with one aspect of the present invention, an integral chip carrier and cable assembly comprises a substantially rigid chip carrier board having two spaced end areas and two transverse side regions. A plurality of flexible cables are integrally formed with the chip carrier board and extend outwardly from at least one of the transverse side regions of the board. Each of the flexible cables have two spaced edge regions each of which are aligned with a respective one of the end regions of the chip carrier board. The integral chip carrier and cable assembly embodying the present invention also includes a plurality of reinforcement members, each of which are disposed along only the end area of the chip carrier board and along only a defined portion of the respectively aligned edge regions of selected ones of the flexible cables.

Other features of the integral chip carrier and cable assembly comprising the present invention include the reinforcement members being disposed on both a top planar surface and a bottom planar surface of the edge regions of the respectively selected ones of the flexible cables. In one arrangement, the reinforcement members are disposed on the edge regions of all of the flexible cables, whereas in another arrangement the reinforcement members are disposed on only the side regions of an upper and a lower flexible cable in the assembly.

In accordance with another aspect of the present invention, a plurality of flexible cables extend outwardly from both of the side regions of the chip carrier board and are arranged such that the side regions of the flexible cables are aligned with a respective end area of the chip carrier board. The reinforcement members are disposed along only a defined portion of the edge region of a selected one of the flexible cables extending outwardly from one side region of the chip carrier board, and along only the respectively aligned end area of the chip carrier board, and along only a defined portion of the edge region of a selected one of the flexible cables extending outwardly from an opposite side region of the chip carrier board.

DETAILED DESCRIPTION OF A PRESENTLY PREFERRED EXEMPLARY EMBODIMENT

Figure 1:
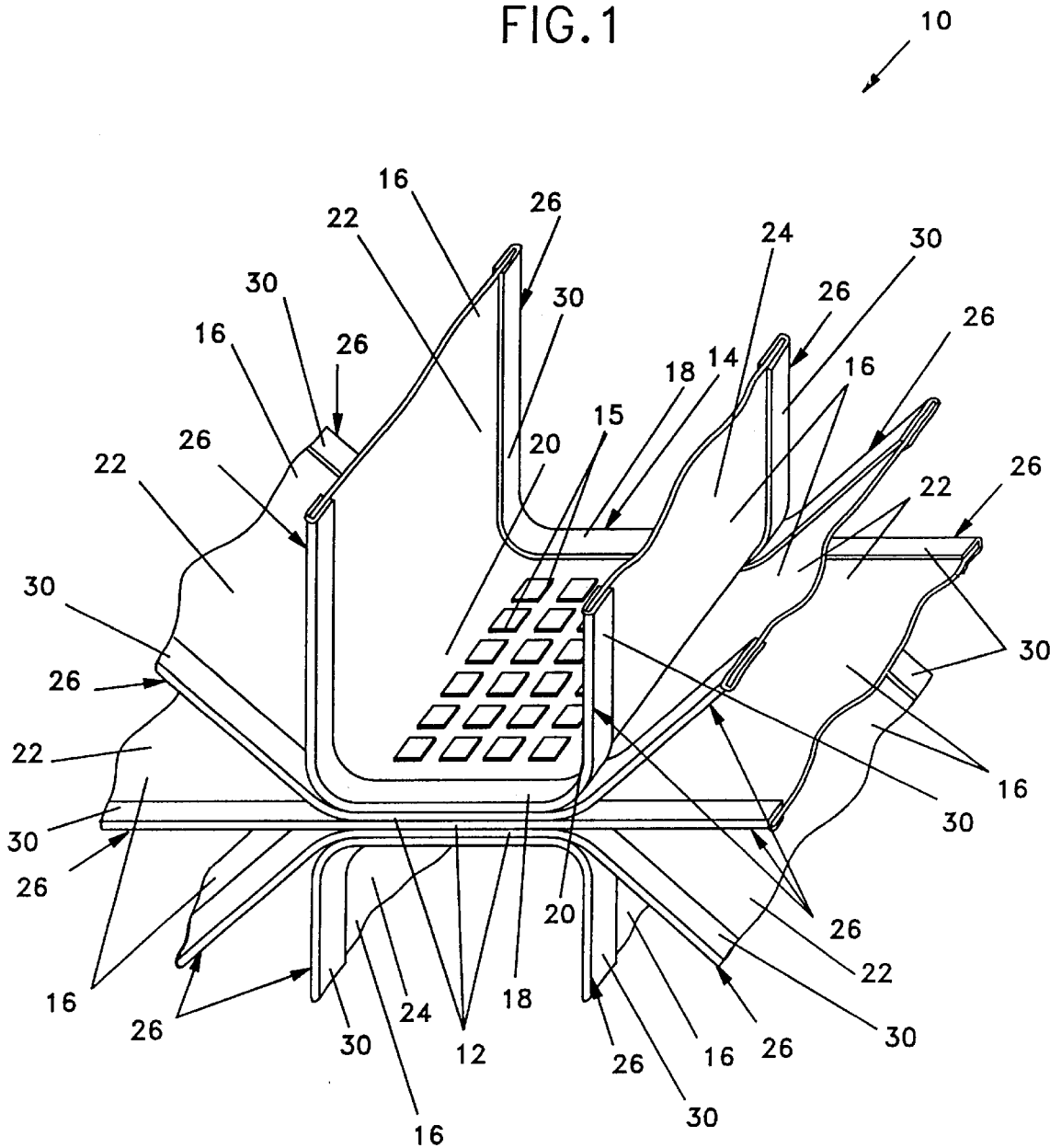
FIG. 1 is a three-dimensional view of an integral chip carrier and cable assembly, embodying the present invention, in which a reinforcement member is disposed on the edge regions of all of the flexible cables in the assembly.

A reinforced chip carrier assembly, embodying the present invention, is described and illustrated herein with particular application to a high performance carrier assembly. The high performance carrier comprises a series of discrete wiring cores 12 that are selectively laminated to form a multilayer rigid-card region 14, suitable for mounting a plurality of integrated circuit chips, chip carriers, or other electronic components which are represented in the drawings by the reference number 15. The rigid-card region 14 is also identified herein as a substantially rigid chip carrier board or circuit board region of the structure 10. As can be readily seen in the drawings, the high performance carrier also includes plurality of independent flexible cables 16 extending outwardly from the rigid-card region 14. Each of the wiring cores 12, and accordingly the chip carrier board 14, have two spaced end areas 18 and two transverse side regions 20. The flexible cables 16 are simultaneously integrally formed with each of the wiring cores 12, and extend outwardly from at least one of the transverse side regions 20 of the cores 12. In the illustrated preferred embodiment, the flexible cables 16 extend outwardly from both side regions 20 of the chip carrier board 14, whereas in other arrangements the flexible cables 16 may extend outwardly from only one of the side regions 20 of the chip carrier board 14.

As described above, the high performance carrier assembly 10, is formed by selectively laminating a series of discrete wiring cores 12 to form the structure comprising the chip carrier board 14 and the flexible cables 16. More specifically, the high performance carrier comprises a plurality of subassemblies each of which include a rigid-card region 14 and a flexible cable 16 extending from the side regions 20 of the individual wiring cores 12. The high performance carrier assembly 10 is then formed by lamination of the individual cores 12 at high temperature, thereby providing the central, substantially rigid, circuit board region 14 and a plurality of flexible cables 16 extending from one, or both, of the side regions 20 of the rigid board region 14. Thus, the flexible cables 16 extending from the side regions 20 of the rigid board region 14 have the same material construction and cross-sectional thickness as the rigid board region 14. Although not shown, the ends of the flexible cables 16 spaced from the rigid board region 14 are provided with suitable connectors for attachment with other components and electrical circuits.

To reduce the overall cross-sectional thickness of the assembled high performance carrier 10, relatively thin materials are used and are selected primarily on their electrical conductivity and dielectric insulation properties. Typically, each subassembled layer of the high performance carrier assembly 10 is formed of multiple layers of electrical circuits, typically copper, and alternating layers of dielectric separators, typically $SiO_2$ filled polytetrafluoroethylene assembled around both sides of a copper-invar-copper core which generally provides a ground plane for the subassembled layer. As mentioned above, these materials provide excellent electrical conductivity and isolation properties, but are prone to transverse tearing, particularly at the transverse side regions 20 where the structure transitions from the rigid core 12 to the flexible cable 16. It has been found that as the flexible cables 16 bend, the primary flexure of the cable occurs at the transition between the flexible and rigid portions of the layer. This flexure encourages cracking and initiation of transverse tears across the individual layers.

Each of the flexible cables 16 have an upper planar surface 22 and a lower planar surface 24, and laterally spaced edge regions 26 on each side of the cable. As can be readily seen in the drawings, each of the edge regions 26 of the flexible cables 16 are respectively aligned with one of the end areas 18 of the chip carrier board 14. In the preferred embodiment of the present invention, the chip carrier and cable assembly 10 embodying the present invention includes a plurality of reinforcement members 30 each of which are disposed, in various environments, along a particular part of end areas 18 of the chip carrier board 14 and along a defined portion of the respectively aligned edge regions 26 of selected ones of the flexible cables 16.

In one arrangement, as shown in FIG. 1, each of the reinforcement members 30 extend on both the upper and lower planar surfaces 22, 24 of the edge regions 26 of the flexible cables 16 and across both the top and bottom of each of the end areas 18 of the separate wiring cores 12 comprising the chip carrier board 14. This arrangement requires deposition or attachment of the reinforcement members 30 during manufacture of the individual wiring core-cable subassembly.

Figure 2:
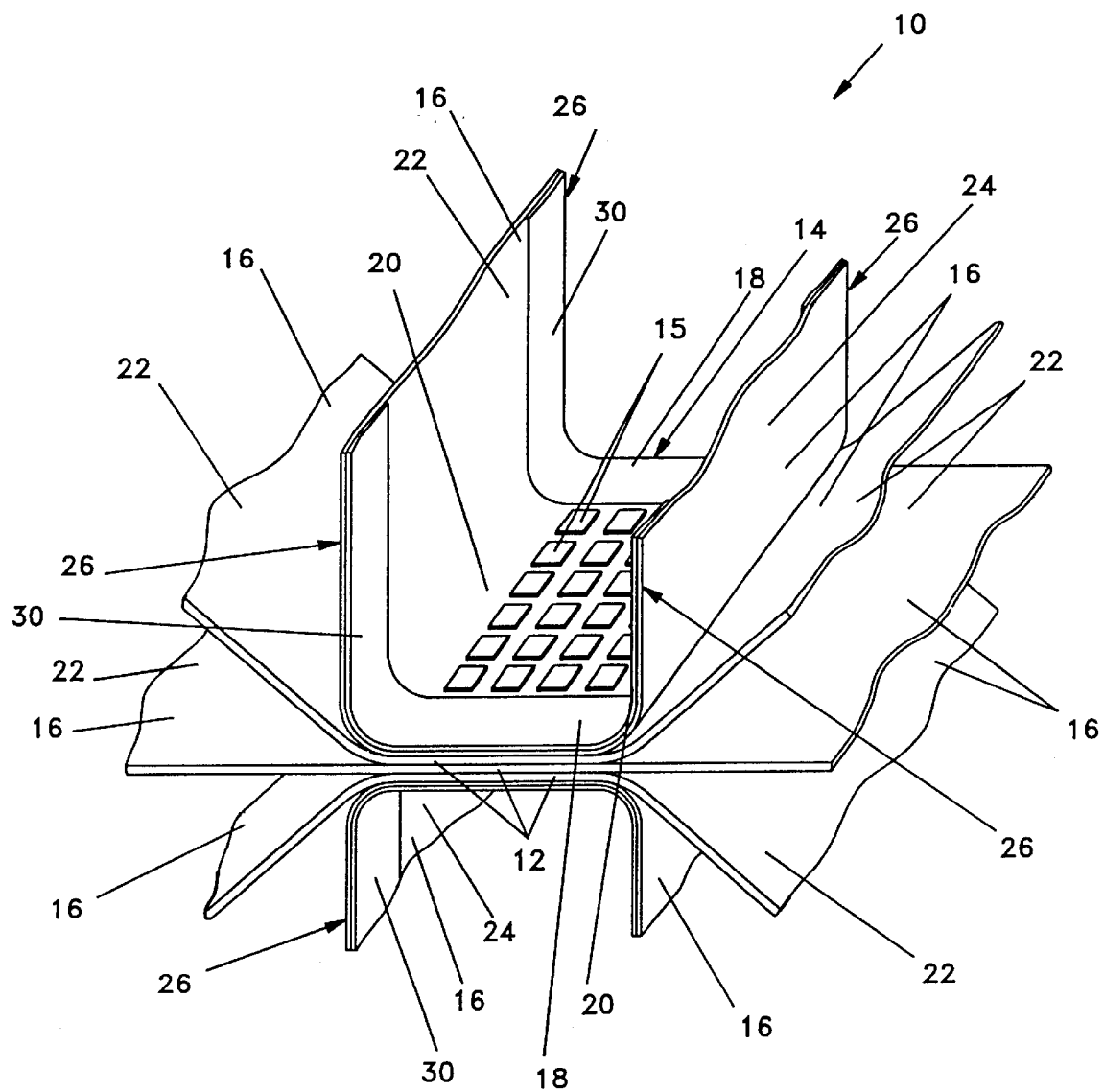
FIG. 2 is a three-dimensional view of an integral chip carrier and cable assembly, embodying the present invention, in which the reinforcement members are disposed on the edge regions of only the upper and lower flexible cables in the assembly.

In another arrangement, shown in FIG. 2, the reinforcement members 30 are disposed along only the external end areas 18 of the chip carrier board 14 and on only the edge regions on the external planar surfaces of the upper and lower flexible cables 16, i.e, on the upper planar surface 22 of the upper flexible cable 16 and on the lower planar surface 24 of the lower most flexible cable 16.

Figure 3:
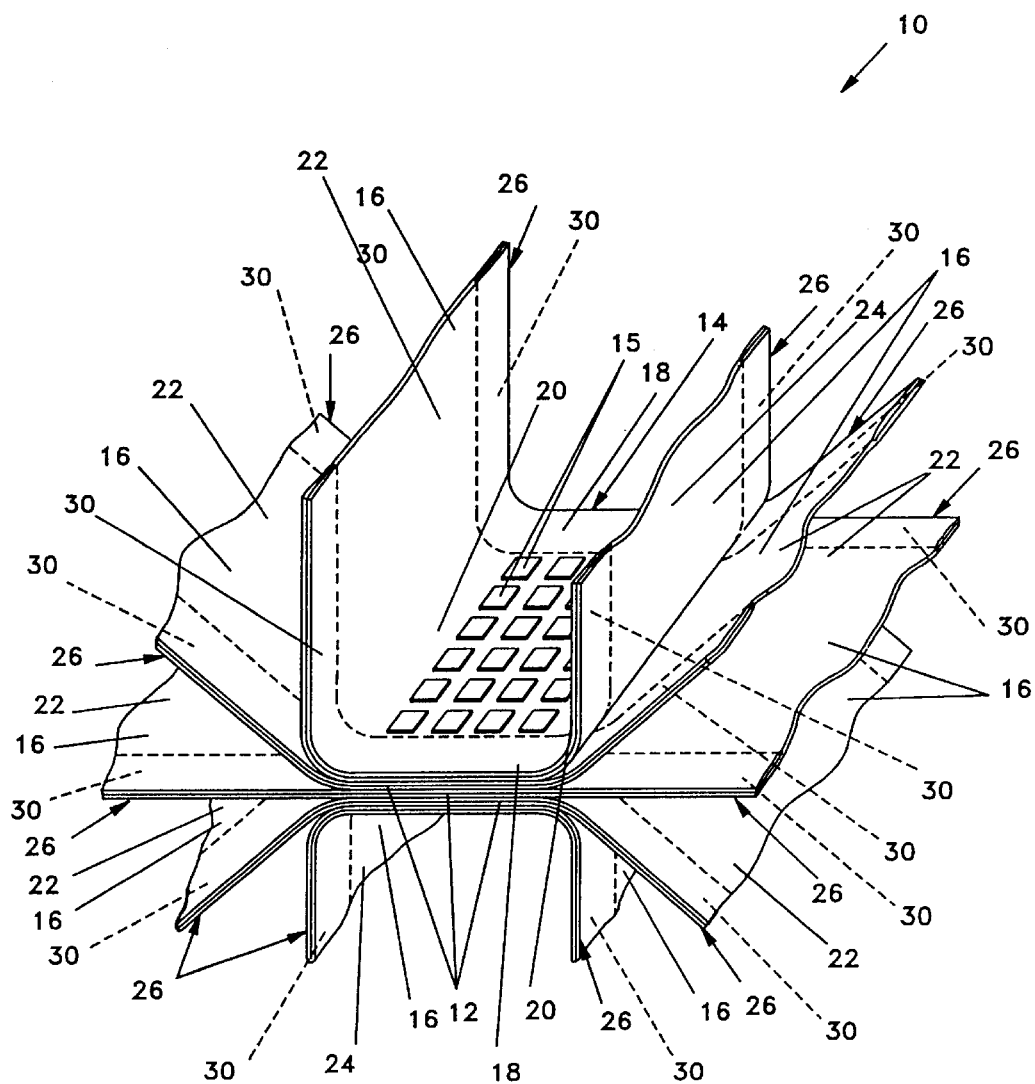
FIG. 3 is a three-dimensional view of an integral chip carrier and cable assembly, embodying the present invention, in which the reinforcement members are internally disposed within the edge regions of the flexible cables.

In yet another arrangement, shown in FIG. 3, the reinforcement members 30 are disposed internally within the edge regions 26 of the flexible cables 16. This arrangement also requires that the reinforcement members 30 be incorporated into the individual cores 12 and cable 16 subassembly prior to lamination into a composite structure 10. In this latter arrangement, the reinforcement members 30 may be incorporated into each of the individuals cores 12 and flexible cables 16, as shown in FIG. 3, or in only the outermost cores 12 and cables 16.

The reinforcement members 30 may be formed of any suitable tear-resistant material and is not dependent upon having acceptable dielectric properties. The material selected for formation of the reinforcement members 30 should have high shear strength, suitable adhesion to the substrate on which it is deposited, and suitable flexibility so that the cables maintain their ability to flex during use. In addition, the reinforcement members should be easy to apply and require minimal impact on current processing steps.

In one embodiment of the present invention, the reinforcement members 30 are formed of a thermoplastic polymer material such as a hot melt adhesive material. Hot melt adhesives are typically copolymers or terpolymers, common examples of which include isoprene-styrene, ethylene-vinyl acetate, and ethylene-vinyl acetate-methacrylic acid. These polymers are commonly dispensed using a heated extrusion device, such as a conventional glue gun, and are readily adaptable to application to the edge regions of the selected flexible cables in accordance with the present invention.

In another embodiment, the reinforcement members 30 are polymer tapes, such as polyimide or polytetrafluoroethylene, precoated with a silicone adhesive, Such tapes are commercially available from 3M Corporation. These tapes may be incorporated along the end areas 18 of the chip carrier board 14 and the edge regions 26 of the flexible cables 16 and importantly, provide reinforcement at the tear susceptible boundary of the cable 16 with the wiring core 12. Excellent adhesion of these tapes to the core and cable is insured due to the roughened topography that exists on the surface of the $SiO_2$ filled PTFE dielectric material used in the formation of the integral chip carrier and cable assembly. Polyimide and PTFE reinforcing tapes are especially desirable materials due to their high tear strength and their excellent thermal resistance, i.e., their ability to withstand multilayer fabrication temperatures.

If the reinforcement tapes 30 are applied prior to composite fabrication, i.e., lamination of the multiple cores to form a single unit, either single, double or folded reinforcement application of the tape may be used. As shown in FIG. 1, the advantages of reinforcing at the individual core level is that reinforcement is continuous along the edge region 26 of the flexible cable 16 and the end areas 18 of the individual subassembled layers. In this arrangement, the reinforcement tape material typically has a width of about ¾ inch and, when doubled over the edge surface of the cable 16 and wiring core 12, extends inwardly from the edge a distance of about ⅜ of an inch on both the upper and lower planar surfaces 22, 24. If applied as a single layer, as shown in FIG.

2, the tape may either be doubled to provide a width of ⅜ of an inch, or extend the full single ply width of ¾ of an inch inwardly from the edge surface of the respective cable 16 and wiring core 12.

When incorporated as an internally disposed member during the individual layer fabrication process, as shown in FIG. 3, the reinforcement member 30 may optionally be formed of a high performance polymer film, e.g., an aromatic polyimide, such as Upilex™ or Kapton™, respectively commercially available from Ube or Dupont. By incorporation into the individual layers, a continuous tear resistant boundary is produced along the entire edges of either the upper and lower layers of the assembly, or all of the layers of the assembly.

Although the present invention is described in terms of a preferred exemplary embodiment, along with specific alternative arrangements of the reinforcement members 30, those skilled in the art will recognize that changes in reinforcement material may be made, consistent with the specifically stated required material properties, without departing from the spirit of the invention. Also, it should be recognized that the reinforcement members 30 may extend along the entire length of the flexible cables or for only a predetermined distance, e.g., six inches, from the chip carrier board 14. Such changes are intended to fall within the scope of the following claims. Other aspects, features and advantages of the present invention can be obtained from a study of this disclosure and drawings, along with the appended claims.

What is claimed is:

1. An integral chip carrier and cable assembly, comprising:
    a substantially rigid chip carrier board formed of a plurality of wiring cores laminated together to form a composite structure, each of said wiring cores having two spaced end areas and two transverse side regions;
    a plurality of flexible cables integrally formed with the wiring cores of said chip carrier board and extending outwardly from said traverse side regions of the wiring cores and having two spaced edge regions each aligned with a respective one of the end areas of the respective wiring cores of the chip carrier board;
    said end areas of each of the wiring cores and the aligned edge regions of each of said flexible cables together define a predefined top planar surface and a predefined bottom planar surface; and
    a plurality of reinforcement members each of which are disposed along only the end areas of selected ones of the wiring cores and along only the aligned edge regions of selected ones of said flexible cables, wherein said reinforcement members are disposed on both the top planar surface and the bottom planar surface of each said selected ones of the wiring cores and flexible cables.

2. An integral chip carrier and cable assembly, as set forth in claim 1, wherein said selected ones of the wiring cores and selected ones of the flexible cables include all of said plurality of wiring cores and said flexible cables comprising said integral assembly.

3. An integral chip carrier and cable assembly, as set forth in claim 1, wherein said plurality of the wiring cores and said plurality of flexible cables are arranged in layered order with an assembled upper one of said wiring cores and an upper one of said flexible cables, an assembled lower one of said wiring cores and a lower one of said flexible cables, and at least one assembled, intermediately disposed one of said wiring cores and an assembled, intermediately disposed one of said flexible cables, said reinforcement members being disposed along only the external surfaces of the end areas of the upper wiring cores and lower wiring cores and along only the external surfaces of the aligned edge regions of the upper and lower ones of said flexible cables.

4. An integral chip carrier and cable assembly, as set forth in claim 1, wherein said reinforcement members are internally disposed within the end areas of the selected ones of the wiring cores and within the aligned edge regions of the selected ones of the flexible cables.

5. An integral chip carrier and cable assembly, as set forth in claim 4, wherein said reinforcement members are formed of a polymer film material.

6. An integral chip carrier and cable assembly, as set forth in claim 1, wherein said plurality of wiring cores and said plurality of flexible cables are arranged in layered order with an assembled upper one of said wiring cores and an upper one of said flexible cables, an assembled lower one of said wiring cores and a lower one of said flexible cables, and at least one assembled, intermediately disposed one of said wiring cores and an assembled, intermediately disposed one of said flexible cables, said reinforcement members being internally disposed within only the end areas of the wiring cores and within only defined portions of the aligned edge regions of said upper and lower ones of said flexible cables.

7. An integral chip carrier and cable assembly, as set forth in claim 1, wherein said reinforcement members are formed of a thermoplastic material applied as an extruded liquid onto the end areas of said selected one of the wiring cores and to the aligned edge regions of said selected ones of the flexible cables.

8. An integral chip carrier and cable assembly, as set forth in claim 1, wherein said reinforcement members are formed of a polymer material bonded with only the end areas of the selected ones of the wiring cores and with only the aligned edge regions of said selected ones of the flexible cables.

9. An integral chip carrier and cable assembly, comprising:
    a substantially rigid chip carrier board formed of a plurality of wiring cores laminated together to form a composite structure, each of said wiring cores having two spaced end areas, a first transverse side region, and a second transverse side region spaced from said first transverse side region;
    a plurality of flexible cables that are integrally formed with respective ones of said wiring cores, said flexible cables being arranged such that one of said flexible cables outwardly from the first transverse side region of each of said wiring cores, each of said flexible cables having two spaced edge regions each of which are aligned with a respective one of the end areas of the respective ones of said wiring cores;
    said end areas of each of the respective ones of said wiring cores and the edge regions of each of said flexible cables together define a predefined top planar surface and a predefined bottom planar surface; and
    a plurality of reinforcement members each of which are disposed along only the edge region of selected ones of the flexible cables, and along only the end areas of selected ones of the respective ones of said wiring cores, wherein said reinforcement members are disposed on both the top planar surface and the bottom planar surface of each said selected ones of the respective one of the wiring cores and flexible cables.

10. An integral chip carrier and cable assembly, as set forth in claim 9, wherein said selected ones of the respective ones of said wiring cores and said selected ones of the flexible cables include all of said plurality of wiring cores and said plurality of flexible cables comprising said integral assembly.

11. An integral chip carrier and cable assembly, as set forth in claim 9, wherein said plurality of the wiring cores and said plurality of flexible cables are arranged in layered order with an assembled upper one of said wiring cores and an upper one of said flexible cables, an assembled lower one of said wiring cores and a lower one of said flexible cables, and at least one assembled, intermediately disposed one of said wiring cores and an assembled, intermediately disposed one of said flexible cables, said reinforcement members being disposed along only the external surfaces of the end areas of the upper wiring cores and lower wiring cores and along only the external surfaces of the aligned edge regions of the upper and lower ones of said flexible cables.

12. An integral chip carrier and cable assembly, as set forth in claim 9, wherein said reinforcement members are internally disposed within the end areas of the selected ones of the respective ones of the wiring cores and within the edge regions of the selected ones of the flexible cables.

13. An integral chip carrier and cable assembly, as set forth in claim 12, wherein said reinforcement members are formed of a polymer film material.

14. An integral chip carrier and cable assembly, as set forth in claim 9 wherein said plurality of wiring cores and said plurality of flexible cables are arranged in layered order with an assembled upper one of said wiring cores and an upper one of said flexible cables, an assembled lower one of said wiring cores and a lower one of said flexible cables, and at least one assembled intermediately disposed one of said wiring cores and an assembled, intermediately disposed one of said flexible cables, said reinforcement members being internally disposed within only the end areas of the selected ones of respective ones of said wiring cores and within only defined portions of the aligned edge regions of the upper and lower ones of said flexible cables.

15. An integral chip carrier and cable assembly, as set forth in claim 9, wherein said reinforcement members are formed of a thermoplastic material applied as an extruded liquid onto the end areas or said selected one of the respective ones of said wiring cores and to the edge regions of said selected ones of the flexible cables.

16. An integral chip carrier and cable assembly, as set forth in claim 9, wherein said reinforcement members are formed of a polymer material bonded with only the end areas of the selected ones of the respective ones of said wiring cores and with only the edge regions of said selected ones of the flexible cables.

* * * * *